United States Patent
Li

(10) Patent No.: US 6,889,004 B2
(45) Date of Patent: May 3, 2005

(54) THERMAL PROCESSING SYSTEM AND THERMAL PROCESSING METHOD

(75) Inventor: Yicheng Li, Shiroyama-Machi (JP)

(73) Assignee: Tokyo Electron Limited, Tokyo (JP)

( * ) Notice: Subject to any disclaimer, the term of this patent is extended or adjusted under 35 U.S.C. 154(b) by 197 days.

(21) Appl. No.: 10/257,621

(22) PCT Filed: Apr. 17, 2001

(86) PCT No.: PCT/JP01/03277

§ 371 (c)(1),
(2), (4) Date: Oct. 16, 2002

(87) PCT Pub. No.: WO01/82341

PCT Pub. Date: Nov. 1, 2001

(65) Prior Publication Data

US 2003/0089697 A1 May 15, 2003

(30) Foreign Application Priority Data

Apr. 20, 2000 (JP) .................................. 2000-119326

(51) Int. Cl.[7] .................................................. F26B 3/30
(52) U.S. Cl. ...................... 392/418; 392/416; 219/390; 219/405; 219/411
(58) Field of Search ................... 219/390, 405, 219/411; 392/416, 418; 118/729, 725, 50.1

(56) References Cited

U.S. PATENT DOCUMENTS

| | | | |
|---|---|---|---|
| 5,376,862 A | | 12/1994 | Stevens |
| 5,482,602 A | * | 1/1996 | Cooper et al. ......... 204/192.11 |
| 5,840,125 A | | 11/1998 | Gibbons et al. |
| 5,902,185 A | * | 5/1999 | Kubiak et al. ................ 464/29 |
| 5,982,986 A | * | 11/1999 | Davenport .................. 392/418 |

* cited by examiner

Primary Examiner—Shawntina Fuqua
(74) Attorney, Agent, or Firm—Crowell & Moring LLP

(57) ABSTRACT

A thermal processing system for heating a to-be-processed object while rotating the to-be-processed object by a placement part, and for performing thermal processing on the to-be-processed object by supplying a predetermined gas into a processing chamber. An outer ring part provided outside the processing chamber and an inner ring part provided inside the processing chamber have pluralities of circumferentially arranged magnetic poles. The magnetic poles apply magnetic forces between the outer ring part and inner ring part so that the inner ring part will follow the rotation of the outer ring part. The number of magnetic poles of the outer ring part and inner ring part are selected to achieve an allowable angular error when between the outer ring part and inner ring part during rotation.

16 Claims, 7 Drawing Sheets

THERMAL PROCESSING SYSTEM AND THERMAL PROCESSING METHOD

TECHNICAL FIELD

The present invention relates to a system and a method for performing thermal processing on a to-be-processed object such as a semiconductor wafer, for example, while rotating the to-be-processed object by using a magnetic coupling.

BACKGROUND ART

In a single-wafer thermal processing system, as one of a semiconductor manufacturing system, a semiconductor wafer (referred to simply as a wafer, hereinafter) is heated by lamps, and, thermal processing such as annealing, CVD, and oxidization processing are performed on the wafer. In this case, in order to heat the entire surface of the wafer uniformly, it is necessary to rotate the wafer with respect to the heating lamps. Such a type of system is disclosed by U.S. Pat. No. 5,755,511, for example. In this system, heating lamps are disposed above a processing chamber via a transmitting window, and also, an outer ring part outside of the processing chamber and an inter ring part inside of the processing chamber are coupled through a magnetic coupling at a bottom of the processing chamber, where the outer ring part and inner ring part are provided rotatably with respect to a fixed part of the processing chamber via bearing parts. The bearing parts include metal balls which directly come into contact with the outer ring part and inner ring part, respectively, and employ grease as a lubricant agent. Then, a driving part rotates the outer ring part, and the rotation force is transmitted to the inner ring part through the magnetic coupling. Thereby, a wafer placement part provided on the inner ring part is rotated.

In the above-mentioned system, as the grease is used as the lubricant agent in the bearing parts, the friction force is small. Accordingly, the inner ring part precisely follows the outer ring part rotating although the magnetic coupling has a small magnetic force. Thereby, the wafer on the wafer placement part stops in a predetermined orientation at high accuracy when the outer ring part is stopped. However, there is a possibility that vapor of the grease used in the bearing parts as the lubricant agent may contaminate the wafer. Further, as the inner ring part rotates on the rolling balls of the bearing parts, this type of bearing parts are not suitable for high-speed rotation.

Accordingly, the inventor of the present invention has been studying a ceramic bearing part not employing grease. However, as the ceramic bearing part has a friction force larger than that of a bearing part employing grease, when an outer ring part is stopped, an inner ring part stops in an orientation different from a predetermined orientation, that is, it stops in a condition in which a magnetic pole of the inner ring part is shifted in center from a magnetic pole of the outer ring part.

On the other hand, recently, in order to improve in-situ successive processing and throughput, a system called a cluster tool has been developed in which a plurality of thermal processing parts are connected to a conveying room including a conveying arm in an air-tight manner, and thermal processing is performed on a water successively therethrough. In the cluster tool, in order to perform a uniform process, the wafer is rotated by a placement table in some processing parts. In this case, a recess (depression) part which is an engagement part into which the wafer is fitted is formed in the placement table, and the wafer is rotated in a condition in which the wafer is fitted into the recess part.

Because the wafer has a orientation flat or V-shaped notch which is used as a mark for indicating an orientation of crystal. When an orientation in which the wafer is stopped from rotation in one thermal processing part is shifted from a predetermined orientation, the wafer is conveyed into a processing chamber of a subsequent thermal processing part in a condition in which the wafer is oriented in a wrong orientation. As a result, the wafer is not fitted into the recess part of the placement table of the subsequent processing part.

It is possible to attempt previously controlling a motor so as to compensate an expected shift/error in orientation of the wafer at the time of stopping of rotation. However, in such a method, when a friction torque is changed slightly with age, the stopping orientation is affected thereby. Accordingly, this method may not be practical.

Disclosure of the Invention

The present invention has been contrived under the above-described situation, and, an object of the present invention is to provide an art by which, when thermal processing is performed on a to-be-processed object under a condition in which the to-be-processed object is rotated by a placement part by using a magnetic coupling and ceramic bearing parts, the to-be-processed object can be stopped at a predetermined orientation at high accuracy, and, as a result, when successive processing is performed by using a plurality of thermal processing parts, for example, it is possible to convey the to-be-processed object in a predetermined orientation into a subsequent thermal processing part.

A thermal processing system, according to the present invention, heats a to-be-processed object while rotating the to-be-processed object by a placement part, and performs thermal processing on the to-be-processed object by supplying a predetermined gas into a processing chamber. This system includes:

an outer ring part provided outside of the processing chamber, and having a plurality of magnetic poles arranged circumferentially;

an inner ring part provided inside of the processing chamber, having a plurality of magnetic poles arranged circumferentially for applying magnetic forces between the magnetic poles of the outer ring part and those of the inner ring part so as to follow the outer ring part and rotate therewith;

a bearing part provided between the inner ring part and processing chamber; and the placement part rotating together with the inner ring part in the processing chamber, wherein the number of the magnetic poles of the outer ring part and inner ring part is determined such that a torque transmitted to the inner ring part from the outer ring part is larger than a friction torque generated by the bearing part when the outer ring part is rotated, for an angular difference between the inner ring part and the outer ring part corresponding to a required allowable error in orientation of the to-be-processed objet.

In this configuration, as the transmitted torque is set larger than the friction torque of the bearing part, it is possible to use the bearing part made of ceramic and not employing grease. Accordingly, it is possible to prevent the to-be-processed object from being contaminated by the grease. Although the ceramic bearing part has a large friction torque, it is possible to cause the to-be-processed object to stop in a predetermined orientation from rotation at a high accuracy by appropriately selecting the number of the magnetic poles of the magnetic coupling including the outer and inner ring parts. The number of the magnetic poles of the inner ring part and outer ring part is preferably selected such that the thus-selected number of the magnetic poles is larger than another number of the magnetic poles in which case the torque curve of the torque with respect to the angular error has the maximum torque value among ones in the cases of various numbers of magnetic poles, and also, the inclination of the torque curve for the thus-selected number of magnetic poles at an increasing part thereof is larger than that in the case of the other number of the magnetic poles.

By applying the present invention to a so-called cluster tool in which a plurality of processing chambers are connected with a conveying room in an airtight manner, it is possible to place the to-be-processed object in a predetermined orientation on a placement part when, after the to-be-processed object has undergone thermal processing in one of the processing chambers, the to-be-processed object then undergoes thermal processing in a subsequent one of the processing chambers.

A thermal processing method according to the present invention using the above-described thermal processing system according to the present invention includes the steps of:

placing the to-be-processed object on the placement part of one thermal processing part;

heating the to-be-processed object while rotating it;

supplying the predetermined gas to the processing chamber and performing the to-be-processed object;

stopping the placement part by stopping the outer ring part; and conveying the to-be-processed object on the placement part to the placement part of another thermal processing part via a conveying room connected between these thermal processing parts in an airtight manner.

Other objects and further features of the present invention will become more apparent from the following detailed description when read in conjunction with the accompanying drawings.

Best Mode for Carrying Out the Invention

Figure 1:
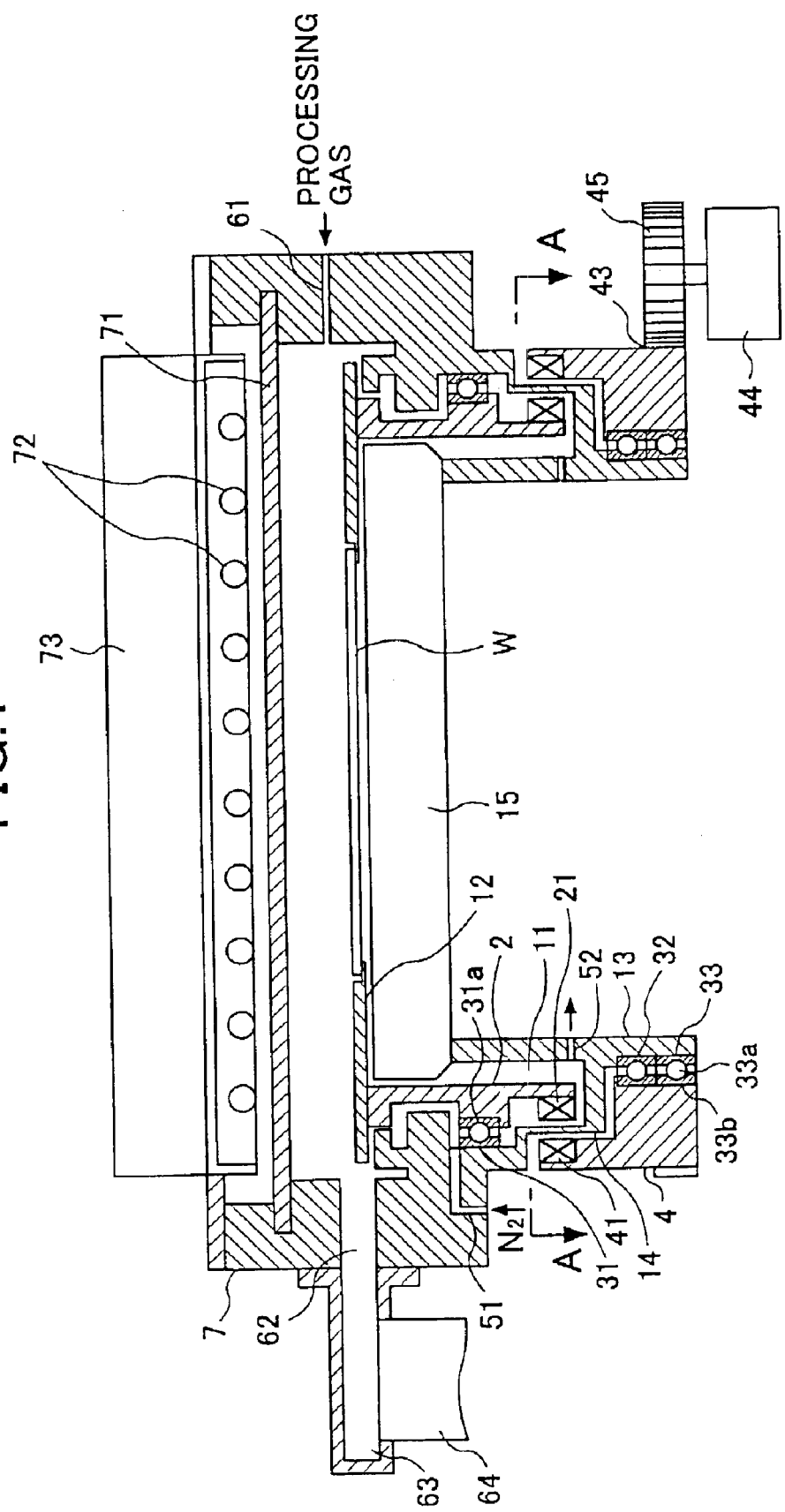
FIG. 1 shows a side-elevational sectional view of a thermal processing system in one embodiment of the present invention.

FIG. 1 shows a side-elevational sectional view of a thermal processing system in one embodiment of the present invention. The system includes a flat processing chamber 7 made of aluminum (A5052), for example, and has an inner side wall having a circular cross-sectional shape. The processing chamber 7 has a ring-shaped groove part 11 in the periphery at a bottom part thereof. An inner ring part 2 is provided in the groove part 11. The inner ring part 2 is provided on an inner wall of the groove part 11 via a bearing part 31 rotatably around a vertical axis. This bearing part 31 is a ceramic bearing part for a vacuum use, and has a structure such that balls 31a which are rolling members made of silicon nitride so as to be superior in abrasion resident, heat resident and corrosion residence are held in a holder (provided between the balls 31a, not shown in the figure) made of a self-lubricative material such as fluororesin, for example.

Figure 2:
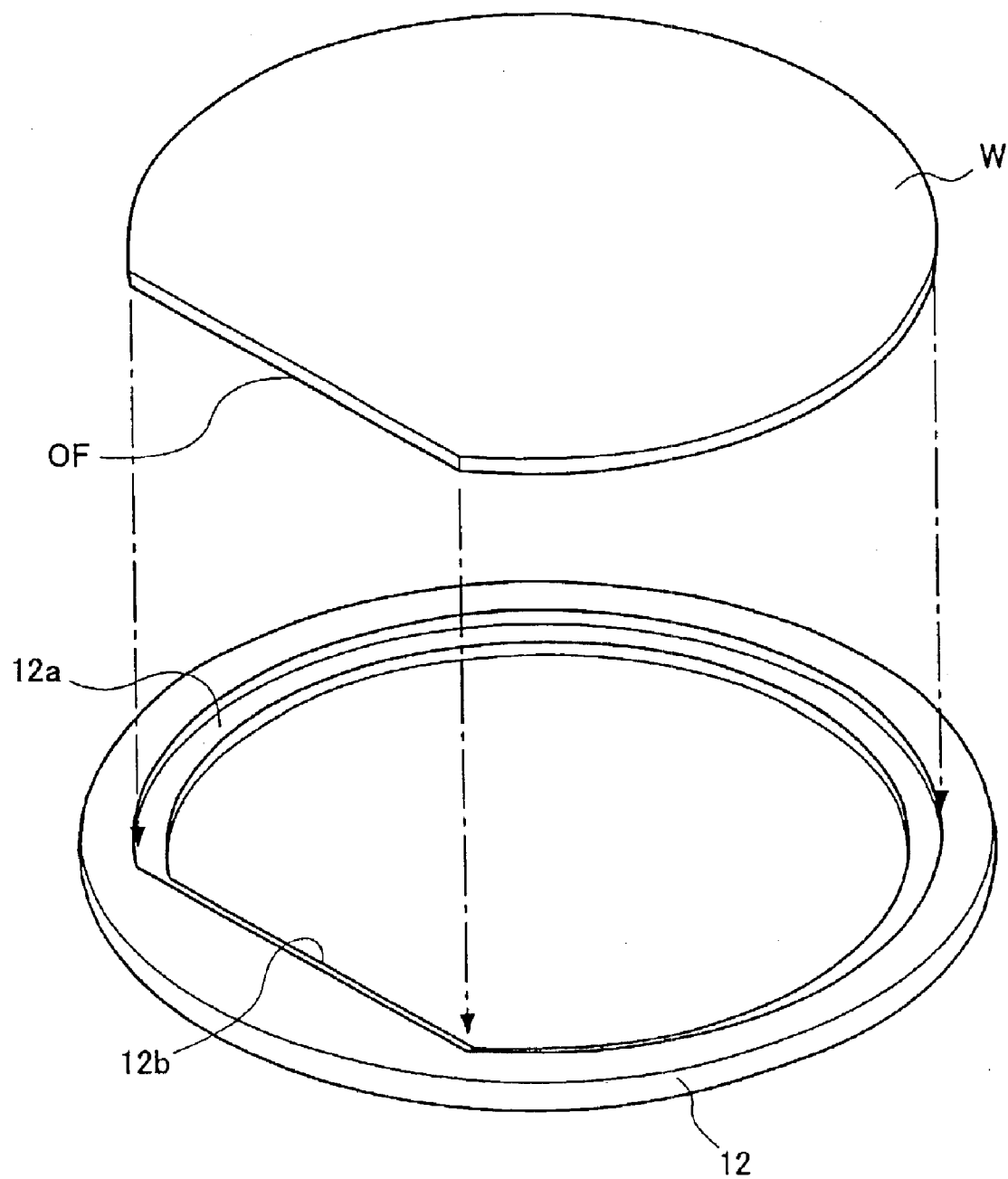
FIG. 2 shows a perspective view illustrating a placement part used in the thermal processing system shown in FIG. 1.

At a top end of the inner ring part 2, a ring-shaped placement part 12 for holding the periphery of a wafer W acting as a to-be-processed object, is provided, and is rotated together with the inner ring part 22 integrally. In the surface of the placement part 12, in a case of orientation-flat type wafer, a step part (counterbore) 12a acting as a positioning part is formed into a shape the same as that of the wafer W for the purpose of placement of the wafer W in a condition in which the wafer W is oriented properly with respect to the placement part 12, as shown in FIG. 2. In FIG. 2, a part 12a corresponds to the orientation flat OF of the wafer W.

A housing 13 forming the groove 11 extends downward as a part of the processing chamber 7, and, an outer ring part 13 is held by the housing 13 rotatably around a vertical axis via bearing parts 32 and 33 provided as two stages arranged vertically on the outer wall of the housing 13. Because these bearing parts 32 and 33 are located outside of the processing chamber 7, they may be bearing parts employing grease, for example.

Figure 3:
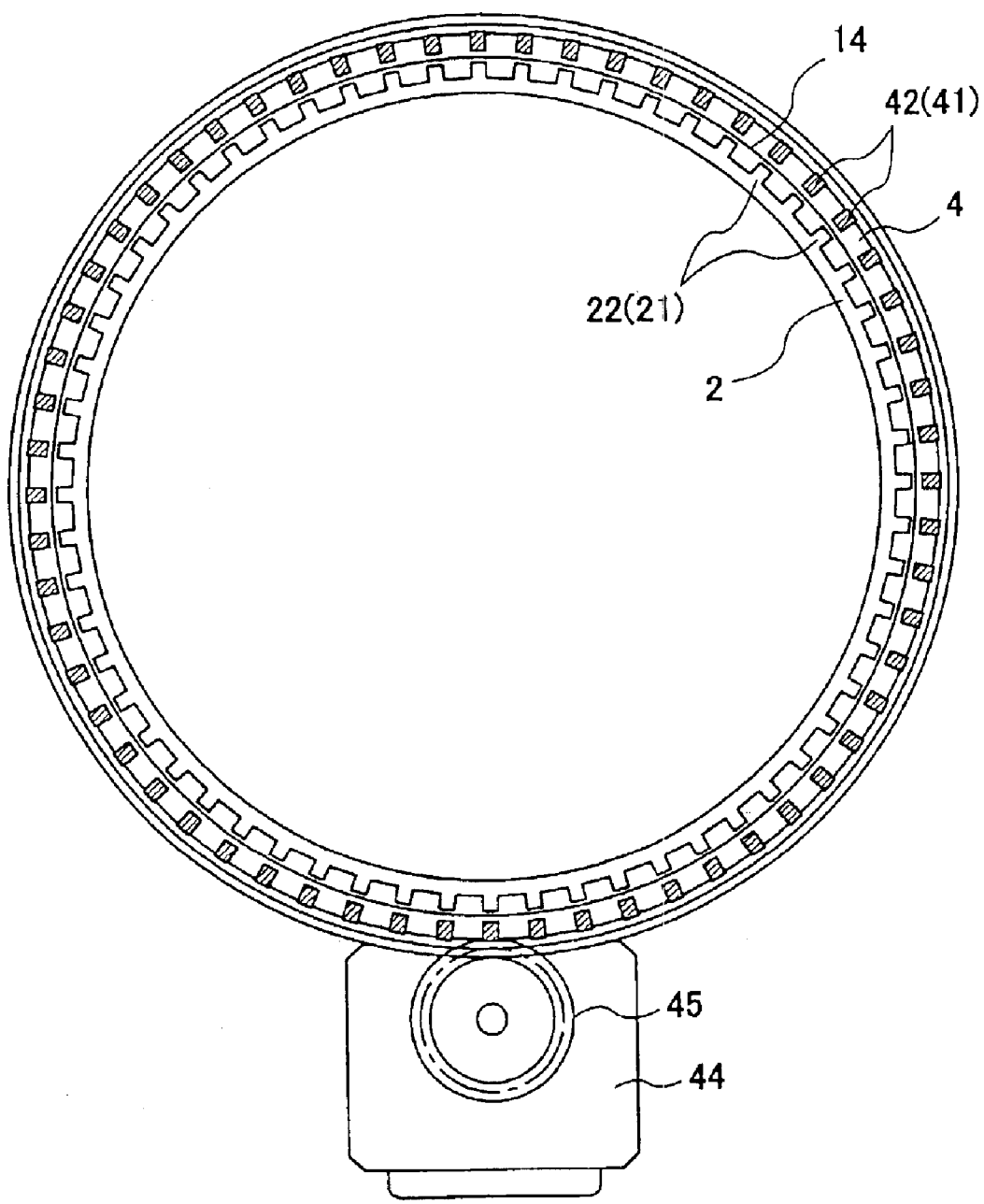
FIG. 3 shows a cross sectional view illustrating an inner ring part and an outer ring part used in the in the thermal processing system shown in FIG. 1.

Magnetic poles 21 and 41 are provided on the above-mentioned inner ring part 2 and outer ring part 4, and thus form a magnetic coupling as a result of being disposed on the inner and outer surfaces of a partition 14, respectively. The partition 14 is formed of a non-magnetic material such as aluminum or non-magnetic steel (SUS304, for example). FIG. 3 shows the inner ring part 2, partition 14 and outer ring part 4 in a cross-sectional view of FIG. 1 taken along a line A—A. In FIG. 3, the inner ring part 2 is made of a martensitic stainless steel (SUS440C) which is a high-permeability material, and, has a plurality of, for example, 60 rectangular projections 22 along the outer circumferential periphery thereof. These projections 22 correspond to the above-mentioned magnetic poles 21.

Figure 4:
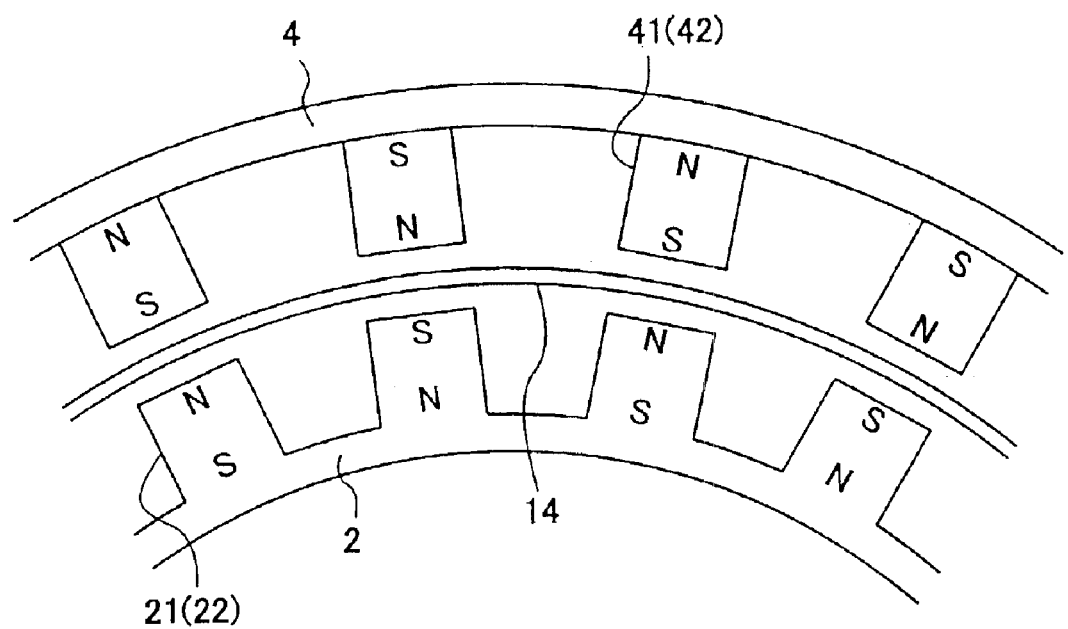
FIG. 4 shows a magnified plan view illustrating arrangements of magnetic poles of the above-mentioned inner ring part and outer ring part.

The outer ring part 4 has, for example, 60 permanent magnets 42 made of neodymium magnets corresponding to the magnetic poles 41 and corresponding to the above-mentioned magnetic poles 21 of the inner ring part 2. Each magnetic pole 41 (permanent magnet 42) has an N-pole and an S-pole inside and outside every second one, while the other each magnetic pole 41 has an S-pole and an N-pole inside and outside, as shown in FIG. 4. Accordingly, along the arrangement of the magnetic poles 41, the N-poles and S-poles are arranged alternately. Corresponding thereto, with regard to the magnetic poles 21 of the inner ring part 2, each magnetic pole 21 has an N-pole and an S-pole inside and outside every second one, while the other each magnetic pole 21 has an S-pole and an N-pole inside and outside. The outer diameter of the inner ring part 2 and inner diameter of the outer ring part 4 are around 370 mm and 380 mm, respectively, for example.

Figure 5:
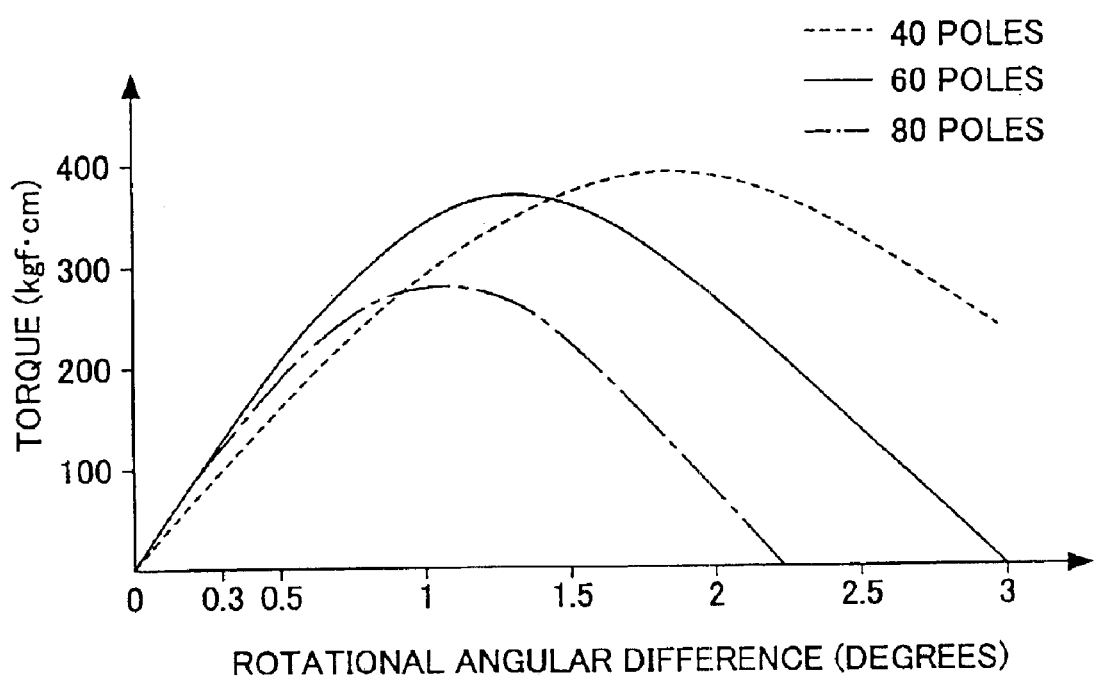
FIG. 5 shows torque curves of magnetic couplings including one used in the embodiment shown in FIG. 1.
Figure 6:
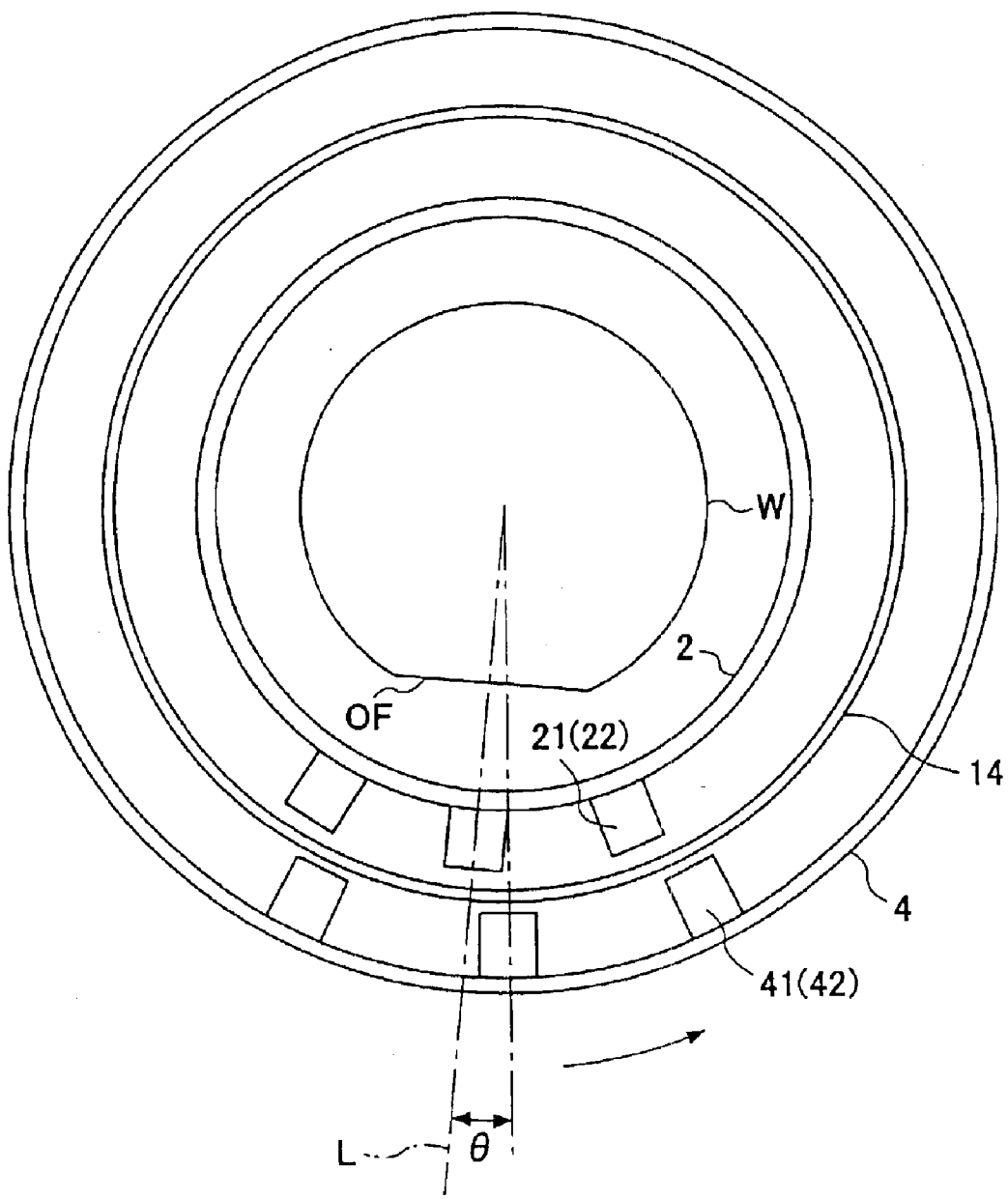
FIG. 6 illustrates an angular difference between the inner ring part and the outer ring part of the embodiment shown in FIG. 1.

The reason of determining the number of magnetic poles (21, 41) of the magnetic coupling used in the embodiment, as 60, will now be described with reference to FIG. 5. FIG. 5 shows torque curves representing relationships between a torque applied to the inner ring part 2 and a difference in angle between the corresponding magnetic poles 21 and 41 (rotational angular difference) of the outer ring part 4 and inner ring part 2 when the outer ring part is rotated, in cases of 40 poles, 60 poles and 80 poles of the number of magnetic poles, calculated through a computer. As can be seen from FIG. 5, no torque is generated when the rotational angular difference is zero for any number of magnetic poles. As the rotational angular difference is increased, the torque increases accordingly. Then, the torque becomes maximum for a certain angular difference. Then, as the angular difference is further increased, the torque decreases accordingly. The maximum torque for each number of magnetic poles will be referred to as a maximum transmitted torque. First, the maximum transmitted torque increases as the number of magnetic poles is increased. However, when the number of magnetic poles exceeds a certain value, a repellent force between the magnetic poles increases. Accordingly, the maximum transmitted torque then decreases as the number of magnetic poles is further increased. For example, the maximum transmitted torque is smaller in the case of 60 poles than that in the case of 40 poles as shown in FIG. 5. However, as shown in FIG. 5, although the maximum transmitted torque decreases, an inclination of the torque curve at an increasing part increases as the number of magnetic poles is increased. However, when the number of magnetic poles exceeds a certain value, the above-mentioned inclination also decreases as the number of magnetic poles is further increased. In fact, as shown in FIG. 5, the inclination at an increasing part of the torque curve is smaller in the case of 80 poles than that in the case of 60 poles.

According to the present invention, it is important to enlarge the torque for an allowable angular error with respect to a predetermined orientation, that is, a required accuracy in orientation of the wafer at a time of stopping from rotation. The allowable angular error is, for example, as small as 0.3 degrees. Accordingly, the above-mentioned maximum transmitted torque is not important but the inclination at the increasing part of the torque curve is important for positively stopping the wafer within the required orientation accuracy. By this reason, the number of magnetic poles is selected as 60.

In this case, the maximum transmitted torque of the magnetic coupling is larger than 365 kgf·cm, and the transmitted torque when the shift (angular difference) between the inner ring part 2 and outer ring part 4 is 0.3 degrees is approximately 132 kgf·cm. The friction torque of the above-mentioned ceramic bearing part 31 is approximately 68 kgf·cm. Accordingly, the transmitted torque is approximately but less than twice the friction torque.

Returning to FIG. 1, a gear part 43 is formed on an outer peripheral surface of the outer ring part 4. The gear part 43 is engaged with a gear part 45 of a stepper motor 44 which is a driving part. Then, the stepper motor 44 drives so as to rotate the outer ring part 4.

A supply path 51 for purge gas such as $N_2$ gas, for example, is formed at a portion near to the outside of the above-mentioned housing 13. The inner end of the supply path 51 is located immediately above the bearing part 31 in the groove part 11. Further, a plurality of discharge paths 52 for the purge gas, for example, are formed and arranged circumferentially, at a portion of the housing 13 near the inside. The purge gas goes into the groove part 11 via the supply path 51 from a gas supply pipe, not shown in the figure, and, then, is discharged via the discharge paths 52 after passing through the bearing part 31, to a discharge pipe, not shown in the figure, externally. By causing the purge gas to flow through the bearing part 31, any dusts which may be generated from the bearing part 31 located inside of the processing chamber 7 are discharged externally by the purge gas. Accordingly, such dusts are prevented from adversely affecting process for the wafer W. Further, the bearing part 31 is cooled by the purge gas.

A lift pin, not shown in the figure, is provided at a bottom part of the processing chamber 7 beneath the wafer W for lifting up the wafer W so as to transfer the wafer to a conveying arm outside of the processing chamber 7. A horizontally elongated slit-shaped gas supply path 61, for example, for supplying processing gas and a discharge path 62 for discharging the processing gas are formed at positions such as to oppose one another in a side wall of the processing chamber 7 slightly above the wafer W. The discharge path 62 is connected to a discharge pipe 64 via a discharge chamber 63 projecting externally from the side wall of the processing chamber 7.

A transmitting window 71 made of quarz, for example, is provided at a top of the processing chamber 7, and, above the transmitting window 71, a ring-shaped, for example, halogen lamps 72 acting as heating parts are provided concentrically. In FIG. 1, a housing 73 holds a power supply system for the halogen lamps 72.

Operation of the above-described embodiment will now be described. First, the wafer W is conveyed by the above-mentioned conveying arm, not shown in the figure, to the placement part 12 via a conveying hole of the processing chamber 7, not shown in the figure. Then, the stepper motor 44 is started rotation, and, thereby, the outer ring part 4 is rotated. At this time, magnetic forces are applied between the magnetic poles 41 of the outer ring part 4 and the magnetic poles 21 of the inner ring part 2. Thereby, the magnetic poles 21 are attracted by the magnetic poles 41. However, due to the friction of the bearing part 31 of the inner ring part 2, only the magnetic poles 41 of the outer ring part 4 rotate until the torque applied to the inner ring part 2 exceeds the friction torque of the bearing part 31. Then, when the torque (transmitted torque) applied to the inner ring part 2 exceeds the above-mentioned friction torque, the magnetic poles 21 start rotation with a delay. FIG. 4 typically shows a state in which the inner ring part 2 rotates with a delay from rotation of the outer ring part 4 due to the above-mentioned reason, when the outer ring part 4 is rotated counterclockwise. As shown in FIG. 4, the inner ring part 2 starts rotation when the outer ring part 4 leads the inner ring part 2 by the angle θ. This angle θ is a difference of the central axis of the magnetic pole 41 with respect to the central axis of the magnetic pole 21, that is, the amount of shift/angular error of the magnetic pole 21 from the position thereof obtained if there were no friction force in the bearing part 31 of the inner ring part 2. Thus, the wafer W rotates.

Then, while the wafer W is rotated at 70 rpm (maximum 288 rpm is possible), predetermined thermal processing is performed on the wafer W as a result of the wafer being heated by radiant heat of the lamps 72 and the processing gas being supplied via the supply path 61. This thermal processing may be, for example, anneal processing in which the wafer W is heated to 1000° C., and, also, inert gas such as $N_2$ is supplied, deposition processing (CVD) in which the wafer W is heated to 600° C., and, also, a deposition gas is supplied, or the like. Then, after the thermal processing is finished, the lamps 72 are turned off, the temperature of the wafer W is decreased, and the stepper motor is stopped after the temperature of the wafer W reaches a predetermined temperature. When the outer ring part 4 thus stops, the inner ring part 2 also stops. However, due to the friction force as described above, the inner ring part 2 stops in an orientation in which the inner ring part 2 lags from the outer ring part 4 by the angel θ. The thus-processed wafer W is conveyed by the conveying arm externally from the processing chamber 7.

According to the above-described embodiment, because the ceramic bearing part 31 not employing grease is used as the bearing part for the placement part, it is possible to prevent the wafer W from being contaminated by the grease. Further, this bearing part has a relatively large friction torque. However, the number of magnetic poles of the magnetic coupling is selected so that the selected number of magnetic poles is larger than that in which case the maximum transmitted torque is maximum among the cases of various numbers of magnetic poles, also, the magnetic coupling having the selected number of magnetic poles has an inclination of the torque curve at the increasing part thereof large enough so that a sufficiently large transmitted torque is secured for an angular difference corresponding to the required allowable range of the orientation of the wafer W at the time of stopping from rotation. The above-mentioned allowable range represents an allowable angular shift/error in orientation of the wafer W with respect to the predetermined orientation for the wafer W to be conveyed out from the processing chamber 7. For example, when the allowable angular error is 0.3 degrees, the transmitted torque should far exceed the friction torque of the above-mentioned bearing part. Accordingly, when the acceleration and deceleration of the rotation of the placement part 12 are increased so as to improve the throughput, for example, the angular error in orientation of the wafer W at the time of stopping from rotation can be controlled to be within the above-mentioned allowable range, positively. Thereby, even when a subsequent process includes the above-described thermal processing, it is possible to fit the wafer W into the step part 12a of the placement part 12. Further, even when a processing system performing a subsequent process merely places the wafer W on the placement part simply, it is possible to always place the wafer W in a fixed orientation. This condition is advantageous for performing analysis of processing results of film thickness, particles, and so forth, on the wafer W.

The required allowable range in angular error of orientation of the wafer W is not limited to 0.3 degrees. According to the present invention, for example, a target one is up to 1.0 degree. Further, with regard to how to select the number of magnetic poles of the magnetic coupling, as long as the value of transmitted torque obtained for the required allowable range in angular error of orientation of the to-be-processed object exceeds the friction torque of the above-mentioned bearing part, any selection is included in the range of the present invention, regardless of the maximum transmitted torque or the inclination of the torque curve at the increasing part thereof. Accordingly, 80 poles may be selected according to the present invention, for example. However, when considering that design be made such that acceleration and deceleration are increased to a certain degree, it is preferable that the transmitted torque obtained for the allowable angular error in orientation of the to-be-processed object is equal to or larger than 1.2 times the friction torque of the bearing part.

Figure 7:
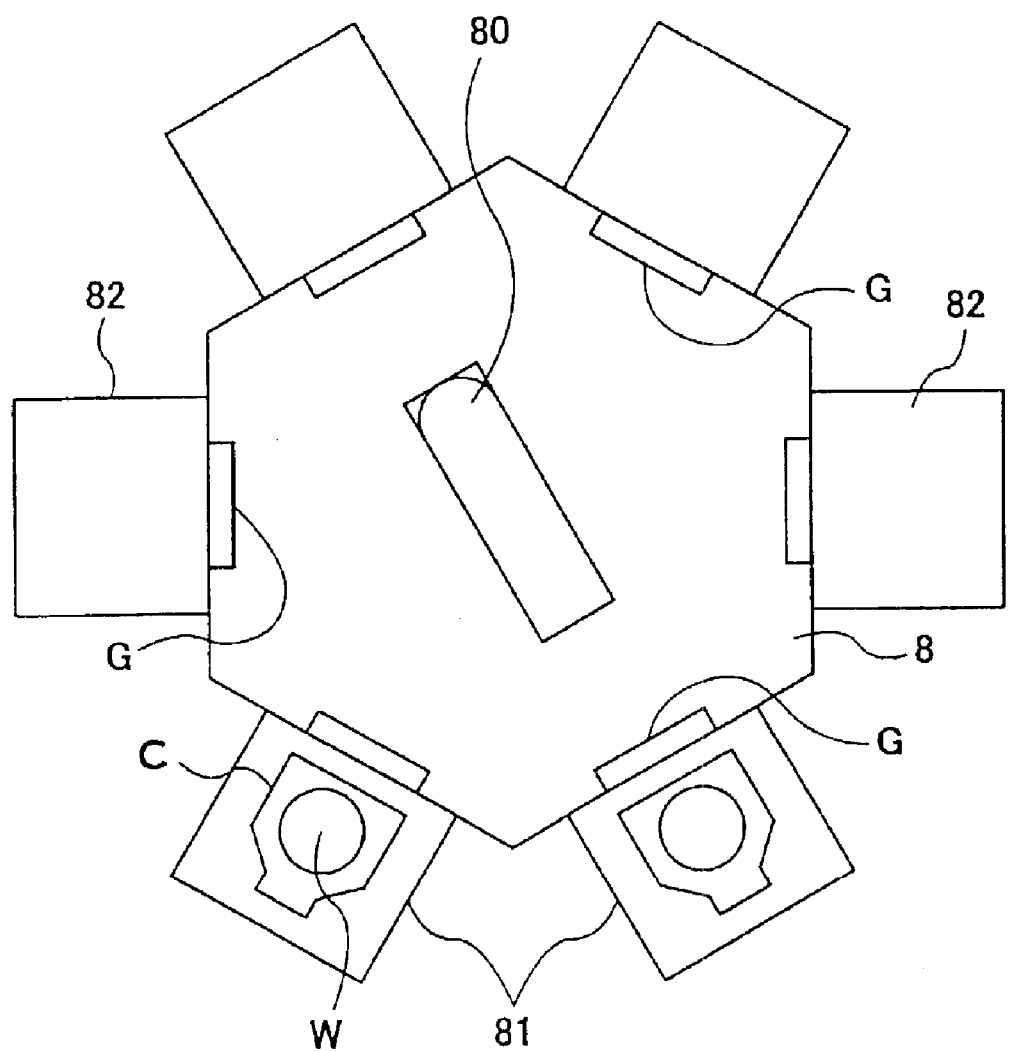
FIG. 7 shows a plan view of a cluster tool including the thermal processing system in the embodiment shown in FIG. 1.

FIG. 7 shows one example of a cluster tool (thermal processing system) to which the above-described embodiment of the present invention is applied. In the thermal processing system, two cassette rooms 81 and four processing chambers 82, for example, are connected with an airtight conveying room 8 including a conveying arm 80, via gate values G in an airtight manner around the conveying room 80. The internal configuration of each processing chamber 82 is the same as that of the above-described embodiment of the present invention. A wafer conveying hole of each processing chamber 82 corresponding to the above-mentioned conveying hole of the above-described processing chamber 7 of the embodiment of the present invention is connected to the conveying room 8 via the gate valve G.

In this thermal processing system, a wafer cassette C holding a plurality of wafers W is conveyed externally into the cassette room 81 after a gate door, not shown in the figure, is opened, the gate door is then closed, then the gate valve G is opened, the wafer W in the cassette C is conveyed into the processing chamber 82 by means of the conveying arm 80, and, then, predetermined processing is performed on the wafer W in the processing chamber 82. After that, this wafer W is conveyed into the other processing chamber 82 by the conveying arm 80, and then predetermined processing is performed on the wafer W in the other processing chamber 82. Thus, successive processing is performed on the wafer W. Then, the thus-processed wafer W is conveyed into the original cassette C, another cassette C of the other cassette room 81, or the like. For example, the processing chamber 82 in which the wafer W is first conveyed performs rapid heating and oxidization processing on the wafer W, and, then, the other processing chamber 82 in which the wafer W is subsequently conveyed performs CVD processing on the wafer W for forming polysilicon.

In this thermal processing system, the wafer W is fitted into the step part 12a of the placement part 12 (see FIGS. 1 and 2). Then, unless the wafer W is oriented within an allowable range of ±0.3 degrees, for example, it is not possible to fit the wafer W into the step part 12a of the placement part 12. According to the present invention, even though the wafer W having undergone the thermal processing has stopped in an orientation slightly different from a predetermined orientation, the difference is controlled within 0.3 degrees. Accordingly, it is possible to properly place the wafer W on the placement part of the subsequent processing chamber 82.

Further, the present invention is not limited to the above-described embodiment, and variations and modifications may be made without departing from the scope of the present invention.

The present application is based on Japanese priority application no. 2000-119326, filed on Apr. 20, 2000, the entire contents of which are hereby incorporated by reference.

What is claimed is:

1. A thermal processing system heating a to-be-processed object while rotating the to-be-processed object by a placement part, and supplying a predetermined gas into a processing chamber and performing thermal processing on the to-be-processed object therein, said system comprising:

an outer ring part provided outside of said processing chamber, and having a plurality of magnetic poles arranged circumferentially;

an inner ring part provided inside of said processing chamber, having a plurality of magnetic poles arranged circumferentially for applying magnetic forces between the magnetic poles of said outer ring part and those of said inner ring part so that said inner ring part follows said outer ring part and rotates therewith;

a bearing part provided between said inner ring part and processing chamber; and said placement part rotating together with said inner ring part in said processing chamber, wherein the number of the magnetic poles of said outer ring part and inner ring part is determined such that a torque transmitted to said inner ring part from said outer ring part is larger than a friction torque applied to said inner ring part by said bearing part when said outer ring part is rotated, for an angular difference between said inner ring part and said outer ring part corresponding to a required allowable angular error of the to-be-processed object.

2. A thermal processing system comprising:

a thermal processing part having a to-be-processed object placed in a predetermined orientation on a placement part in a processing chamber, heating the to be-processed object while rotating the to-be-processed object by said placement part, and performing thermal processing on the to-be-processed object with supplying a predetermined gas into said processing chamber;

a conveying room connected with said processing chamber of said processing part through a gate valve in an airtight manner; and another thermal processing part including a processing chamber and connected with said conveying room via a gate valve in an airtight manner, wherein one of said thermal processing parts performs thermal processing on the to-be-processed object, the to-be-processed object is then conveyed into the other thermal processing part, and said other processing part then performs thermal processing on the to-be-processed object, wherein said one of said thermal processing parts comprises:

an outer ring part provided outside of said processing chamber, and having a plurality of magnetic poles arranged circumferentially;

an inner ring part provided inside of said processing chamber, having a plurality of magnetic poles arranged circumferentially for applying magnetic forces between the magnetic poles of said outer ring part and those of said inner ring part so that said inner ring part follows said outer ring part and rotates therewith;

a bearing part provided between said inner ring part and processing chamber; and said placement part rotating together with said inner ring part in said processing chamber, wherein the number of the magnetic poles of said outer ring part and inner ring part is determined such that a torque transmitted to said inner ring part from said outer ring part is larger than a friction torque applied to said inner ring part by said bearing part when said outer ring part is rotated, for an angular difference between said inner ring part and said outer ring part corresponding to a required allowable error in orientation of the to-be-processed object.

3. The system as claimed in claim 2, wherein orientation of the to-be-processed object is determined as a result of the to-be-processed object being fitted into an orienting part of a placement part of said other thermal processing part.

4. The system as claimed in claim 1, wherein said bearing part comprises a plurality of rolling members made of ceramic and a self-lubricative holder holding said plurality of rolling members.

5. The system as claimed in claim 2, wherein said bearing part comprises a plurality of rolling members made of ceramic and a self-lubricative holder holding said plurality of rolling members.

6. The system as claimed in claim 1, wherein the number of the magnetic poles of said inner ring part and outer ring part is determined such that it is larger than another number of the magnetic poles in which case the torque curve of the torque with respect to the angular difference has the maximum torque value, and also, the inclination of the torque curve for the determined number of magnetic poles at an increasing part thereof is larger than that in the case of said other number of the magnetic poles.

7. The system as claimed in claim 2, wherein the number of the magnetic poles of said inner ring part and outer ring part is determined such that it is larger than another number of the magnetic poles in which case the torque curve of the torque with respect to the angular difference has the maximum torque value, and also, the inclination of the torque curve for the determined number of magnetic poles at an increasing part thereof is larger than that in the case of said other number of the magnetic poles.

8. The system as claimed in claim 1, wherein said required allowable error is 0.3 degrees.

9. The system as claimed in claim 2, wherein said required allowable error is 0.3 degrees.

10. The system as claimed in claim 1, wherein the magnetic poles of one of said outer ring part and inner ring part are made of neodymium magnets, and the magneitic poles of the other thereof are made of martensitic stainless steel.

11. The system as claimed in claim 2, wherein the magnetic poles of one of said outer ring part and inner ring part are made of neodymium magnets, and the magneitic poles of the other thereof are made of martensitic stainless steel.

12. The system as claimed in claim 1, wherein the to-be-processed object is heated through radiant heat.

13. The system as claimed in claim 2, wherein the to-be-processed object is heated through radiant heat.

14. A thermal processing method comprising the steps of:

a) heating a to-be-processed object while rotating the to-be-processed object by a placement part; and b) performing thermal processing on the to-be-processed object with supplying a predetermined gas into a processing chamber, wherein said method is performed by means of:

an outer ring part provided outside of said processing chamber, and having a plurality of magnetic poles arranged circumferentially;

an inner ring part provided inside of said processing chamber, having a plurality of magnetic poles arranged circumferentially for applying magnetic forces between the magnetic poles of said outer ring part and those of said inner ring part so as to follow said outer ring part and rotate therewith;

a bearing part provided between said inner ring part and processing chamber; and said placement part rotating together with said inner ring part in said processing chamber, wherein the number of the magnetic poles of said outer ring part and inner ring part is determined such that a torque transmitted to said inner ring part from said outer ring part is larger than a friction torque applied to said inner ring part by said bearing part when said outer ring part is rotated, for an angular difference between said inner ring part and said outer ring part corresponding to a required allowable error in orientation of the to-be-processed object.

15. A method of calculating the number of magnetic poles in the thermal processing system claimed in any one of the claims 1 through 13, wherein the number of the magnetic poles of the outer ring part and inner ring part is determined such that a torque transmitted to the inner ring part from the outer ring part is larger than a friction torque applied to the inner ring part by the bearing part when the outer ring part is rotated, for an angular difference between the inner ring part and the outer ring part corresponding to a required allowable angular error of the to-be-processed object.

16. The method as claimed in claim 15, wherein the determination of the number of magnetic poles is performed by utilizing torque curves provided for particular numbers of magnetic poles.

* * * * *